(12) United States Patent
Su

(10) Patent No.: US 12,154,788 B2
(45) Date of Patent: *Nov. 26, 2024

(54) METHOD FOR PREPARING SEMICONDUCTOR DEVICE STRUCTURE HAVING FEATURES OF DIFFERENT DEPTHS

(71) Applicant: NANYA TECHNOLOGY CORPORATION, New Taipei (TW)

(72) Inventor: Kuo-Hui Su, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 426 days.

This patent is subject to a terminal disclaimer.

(21) Appl. No.: 17/573,160

(22) Filed: Jan. 11, 2022

(65) Prior Publication Data

US 2023/0223260 A1 Jul. 13, 2023

(51) Int. Cl.
*H01L 21/027* (2006.01)
*H01L 21/033* (2006.01)
*H01L 21/311* (2006.01)

(52) U.S. Cl.
CPC ...... *H01L 21/0273* (2013.01); *H01L 21/0272* (2013.01); *H01L 21/31144* (2013.01)

(58) Field of Classification Search
CPC ............ H01L 21/0273; H01L 21/0272; H01L 21/31144; H01L 21/0337; H01L 21/3081; H01L 21/3086; H01L 21/0274; H01L 21/31056; H01L 21/027; H01L 21/0332–0338; H01L 21/0331–0338;
(Continued)

(56) References Cited

U.S. PATENT DOCUMENTS 11,810,786 B2* 11/2023 Su .................... H01L 21/76816
2015/0155171 A1* 6/2015 Chang ............... H01L 21/32139
438/703
(Continued)

FOREIGN PATENT DOCUMENTS

TW 202147450 A 12/2021

OTHER PUBLICATIONS

Taiwan Office Action dated Jul. 5, 2023 in Application No. 111113285, 7 pages.
(Continued)

*Primary Examiner* — Sonya McCall-Shepard
(74) *Attorney, Agent, or Firm* — MUNCY, GEISSLER, OLDS & LOWE, P.C.

(57) ABSTRACT

A method for preparing a semiconductor device structure includes forming a target layer over a semiconductor substrate, and forming a first energy-sensitive pattern over the target layer. The method also includes performing an energy treating process to transform an upper portion of the first energy-sensitive pattern into a treated portion, forming a lining layer covering the first energy-sensitive pattern, and forming a second energy-sensitive pattern over the lining layer. The first energy-sensitive pattern and the second energy-sensitive pattern are staggered. The method further includes performing an etching process to form a first opening and a second opening in the target layer. The first opening and the second opening have different depths.

11 Claims, 21 Drawing Sheets

(58) Field of Classification Search
CPC ......... H01L 21/32139; H01L 21/76892; H01L 21/76816; G03F 7/0002
See application file for complete search history.

(56) References Cited

U.S. PATENT DOCUMENTS

2018/0151375 A1    5/2018  Hsu et al.
2022/0102150 A1*  3/2022  Tung .................. H01L 21/3081

OTHER PUBLICATIONS

Taiwan Office Action dated Sep. 7, 2023 in Application No. 111113290, 7 pages.

* cited by examiner

METHOD FOR PREPARING SEMICONDUCTOR DEVICE STRUCTURE HAVING FEATURES OF DIFFERENT DEPTHS

TECHNICAL FIELD

The present disclosure relates to a method for preparing a semiconductor device structure, and more particularly, to a method for preparing a semiconductor device structure with openings having different depths.

DISCUSSION OF THE BACKGROUND

Semiconductor devices are essential for many modern applications. With the advancement of electronic technology, semiconductor devices are becoming smaller in size while providing greater functionality and including greater amounts of integrated circuitry. Due to the miniaturized scale of semiconductor devices, various types and dimensions of semiconductor devices providing different functionalities are integrated and packaged into a single module. Furthermore, numerous manufacturing operations are implemented for integration of various types of semiconductor devices.

However, the manufacturing and integration of semiconductor devices involve many complicated steps and operations. Integration in semiconductor devices becomes increasingly complicated. An increase in complexity of manufacturing and integration of the semiconductor device may cause deficiencies. Accordingly, there is a continuous need to improve the manufacturing process of semiconductor devices so that the problems can be addressed.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a method for preparing a semiconductor device structure is provided. The method includes forming a target layer over a semiconductor substrate, and forming a first energy-sensitive pattern over the target layer. The method also includes forming a lining layer covering the first energy-sensitive pattern, and forming a second energy-sensitive pattern over the lining layer. The first energy-sensitive pattern and the second energy-sensitive pattern are staggered. The method further includes performing an etching process to form a first opening and a second opening in the target layer. The first opening and the second opening have different depths.

In an embodiment, the first opening and the second opening are staggered. In an embodiment, the second energy-sensitive pattern is separated from the first energy-sensitive pattern by the lining layer. In an embodiment, a top surface and sidewalls of the first energy-sensitive pattern are covered by the lining layer. In an embodiment, a bottom surface of the second energy-sensitive pattern is higher than a bottom surface of the first energy-sensitive pattern. In an embodiment, a top surface of the second energy-sensitive pattern is higher than a top surface of the first energy-sensitive pattern.

In an embodiment, a top surface of the first energy-sensitive pattern is higher than a bottom surface of the second energy-sensitive pattern. In an embodiment, the lining layer includes an organic polymer material. In an embodiment, the first energy-sensitive pattern, the second energy-sensitive pattern, and the lining layer are removed during the etching process. In an embodiment, the first energy-sensitive pattern and the second energy-sensitive pattern are made of different materials.

In an embodiment, a material of the first energy-sensitive pattern is the same as a material of the second energy-sensitive pattern. In an embodiment, the method further includes performing an energy treating process to transform an upper portion of the first energy-sensitive pattern into a treated portion before the lining layer is formed. In an embodiment, an etching rate of the treated portion is different from an etching rate of the second energy-sensitive pattern during the etching process. In an embodiment, the method further includes performing an energy treating process to transform an upper portion of the second energy-sensitive pattern into a treated portion before the etching process is performed. In an embodiment, an etching rate of the treated portion is different from an etching rate of the first energy-sensitive pattern during the etching process.

In another embodiment of the present disclosure, a method for preparing a semiconductor device structure is provided. The method includes forming a target layer over a semiconductor substrate, and forming a plurality of first energy-sensitive patterns over the target layer. The method also includes forming a lining layer conformally covering the first energy-sensitive patterns. A first opening is formed over the lining layer and between the first energy-sensitive patterns. The method further includes filling the first opening with a second energy-sensitive pattern, and performing an etching process to form a plurality of second openings and a third opening in the target layer, wherein the third opening is between the second openings, and the second openings and the third opening have different depths.

In an embodiment, depths of the second openings are substantially the same. In an embodiment, the first energy-sensitive patterns are made of a first material, the second energy-sensitive pattern is made of a second material, and the first material is different from the second material. In an embodiment, during the etching process, the first energy-sensitive patterns have a first etching rate, and the second energy-sensitive pattern has a second etching rate different from the first etching rate. In an embodiment, during the etching process, the lining layer has a third etching rate, and the first etching rate and the second etching rate are each greater than the third etching rate.

In an embodiment, a material of the first energy-sensitive patterns and a material of the second energy-sensitive pattern are the same. In an embodiment, the method further includes performing an energy treating process to transform at least a portion of each of the first energy-sensitive patterns into a treated portion before the lining layer is formed. In an embodiment, top surfaces and sidewalls of the treated portions are covered by the lining layer. In an embodiment, the method further includes performing an energy treating process to transform at least a portion of the second energy-sensitive pattern into a treated portion before the etching process is performed. In an embodiment, the method further includes performing an energy treating process on each of the first energy-sensitive patterns before the lining layer is formed, and performing another energy treating process on the second energy-sensitive pattern before the etching process is performed.

Embodiments of a method for preparing a semiconductor device structure are provided in the disclosure. The method includes forming a first energy-sensitive pattern over a target layer, forming a lining layer covering the first energy-sensitive pattern, and forming a second energy-sensitive pattern over the lining layer. In some embodiments, the first energy-sensitive pattern and the second energy-sensitive pattern are staggered. The method also includes performing an etching process to form openings in the target layer, and the openings have different depths. Since the openings with different depths can be formed simultaneously, the fabrication cost and time of the semiconductor device structure can be reduced, and greater design flexibility can be achieved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
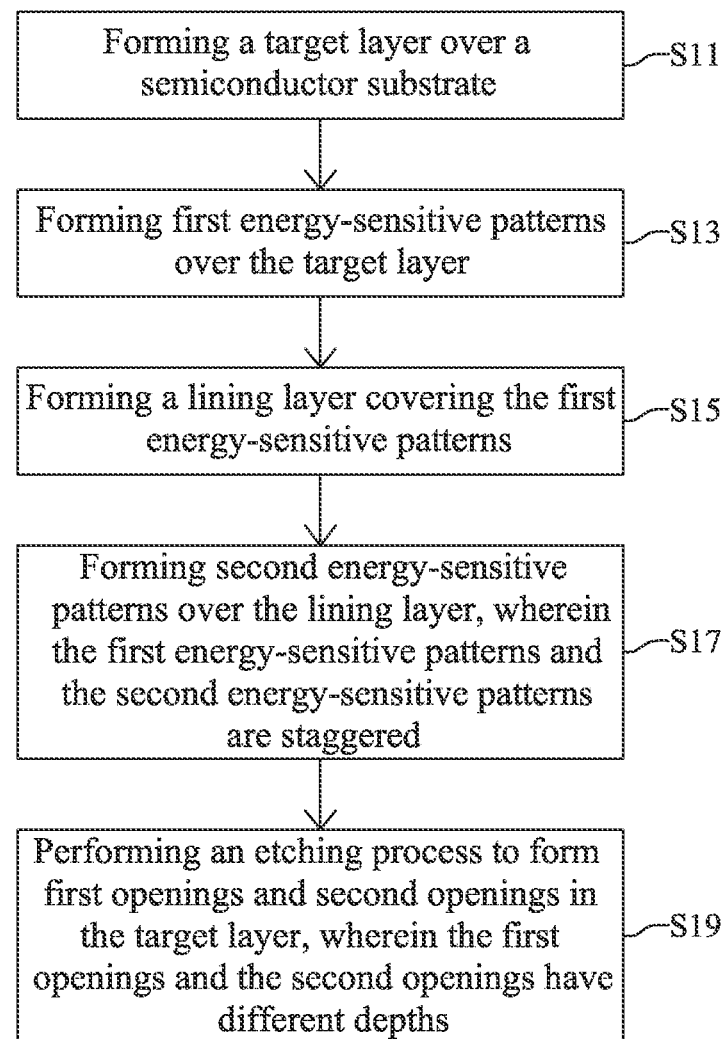
FIG. 1 is a flow diagram illustrating a method for preparing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flow diagram illustrating a method 10 for preparing a semiconductor device structure 100, and the method 10 includes steps S11, S13, S15, S17 and S19, in accordance with some embodiments. The steps S11 to S19 of FIG. 1 are first introduced briefly and then elaborated in connection with FIGS. 5-12. As shown in FIG. 1, the method 10 begins at step S11 where a target layer is formed over a semiconductor substrate.

Next, at step S13, first energy-sensitive patterns are formed over the target layer. In some embodiments, the first energy-sensitive patterns are separated from each other. In some embodiments, the first energy-sensitive patterns include a cross-linking compound having a cross-linking functional group. In some embodiments, the cross-linking functional group includes a double bond.

At step S15, a lining layer is formed covering the first energy-sensitive patterns, and at step S17, second energy-sensitive patterns are formed over the lining layer. In some embodiments, the first energy-sensitive patterns and the second energy-sensitive patterns are staggered. In some embodiments, the first energy-sensitive patterns and the second energy-sensitive patterns are separated from each other by the lining layer.

Subsequently, at step S19, an etching process is performed to form first openings and second openings in the target layer. In some embodiments, the first openings and the second openings have different depths. For example, each of the first openings has a first depth, the first depths are substantially the same, each of the second openings has a second depth, the second depths are substantially the same, and the second depths are different from the first depths.

In some embodiments, the first openings and the second openings are staggered. In some embodiments, the first openings and the second openings are separated from each other. In some embodiments, the first openings and the second openings with different depths are formed in the target layer simultaneously. For example, the first openings and the second openings are formed in the same stage using the same process. The semiconductor device structure 100 is obtained after the step S19.

Figure 2:
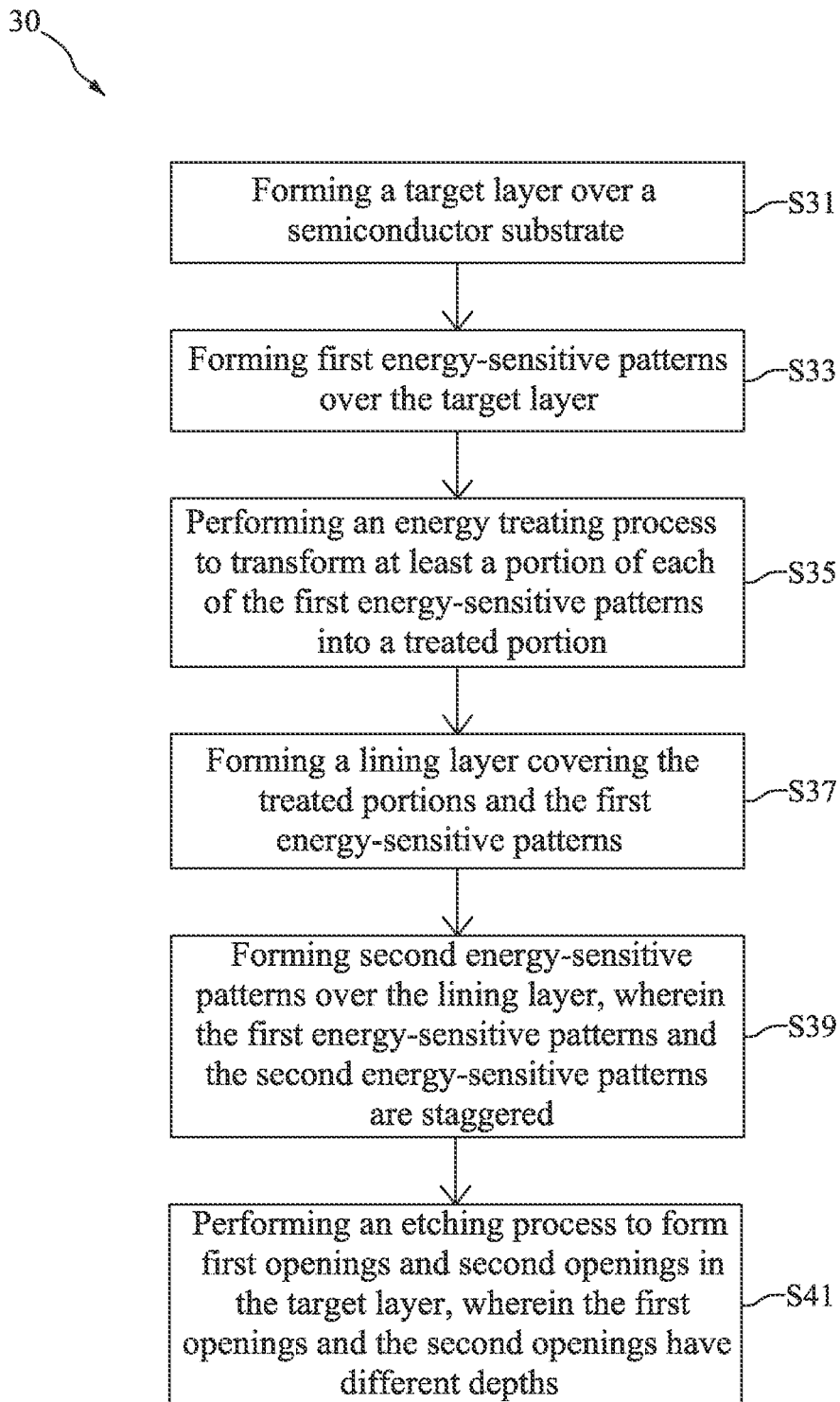
FIG. 2 is a flow diagram illustrating a method for preparing a semiconductor device structure, in accordance with some embodiments.

FIG. 2 is a flow diagram illustrating a method 30 for preparing the semiconductor device structure 100, and the method 30 includes steps S31, S33, S35, S37, S39 and S41, in accordance with some embodiments. The steps S31 to S41 of FIG. 2 are first introduced briefly and then elaborated in connection with FIGS. 13-15 or FIGS. 16-18. The steps S31 and S33 are similar to the steps S11 and S13 of FIG. 1.

After the first energy-sensitive patterns are formed, at step S35, an energy treating process is performed to transform at least a portion of each of the first energy-sensitive patterns into a treated portion. In some embodiments, upper portions of the first energy-sensitive patterns are transformed into treated portions. In some embodiments, the first energy-sensitive patterns are fully transformed into treated portions.

Moreover, in some embodiments, the energy treating process includes an electron-beam (e-beam) writing process. However, any other suitable process, such as an ion-beam writing process, may alternatively be utilized.

Next, the step S37 is similar to the step S15 of FIG. 1. In some embodiments, the treated portions formed by the step S35 are covered by the lining layer. The steps S39 and S41 are similar to the steps S17 and S19 of FIG. 1. As mentioned above, the first openings and the second openings with different depths are formed in the target layer simultaneously. For example, the first openings and the second openings are formed in the same stage using the same process.

Figure 3:
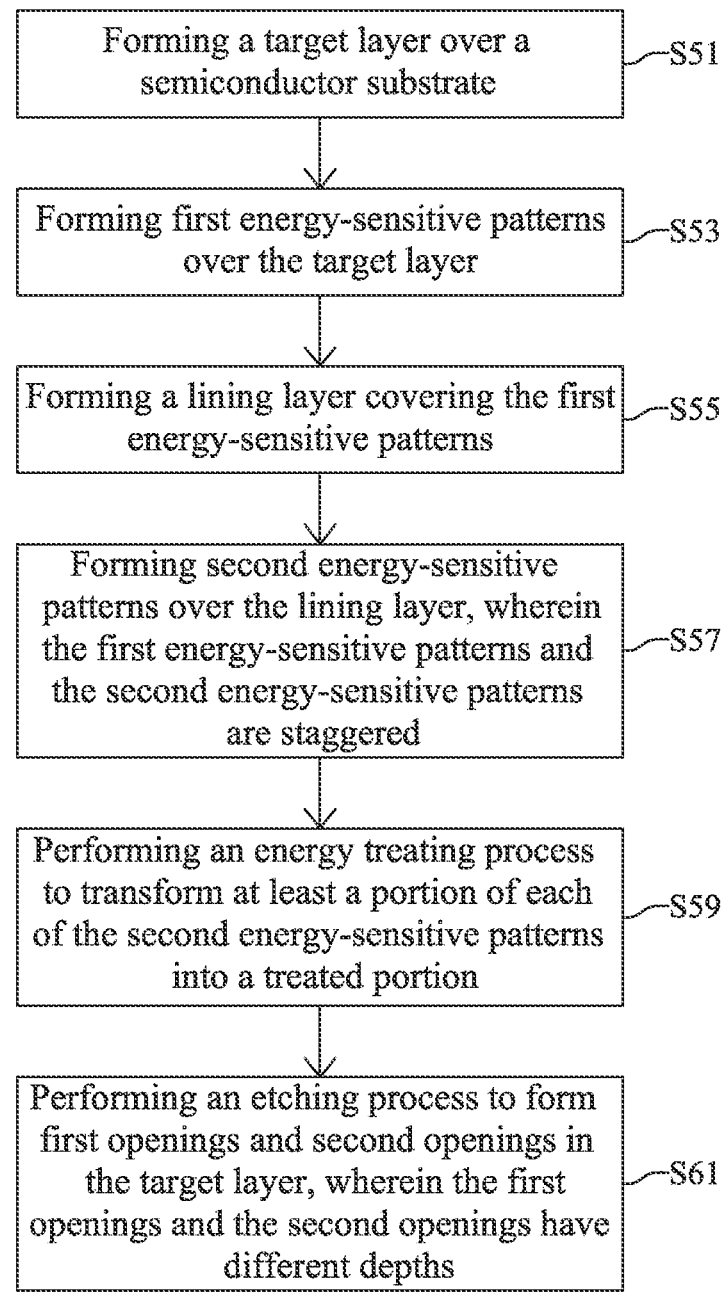
FIG. 3 is a flow diagram illustrating a method for preparing a semiconductor device structure, in accordance with some embodiments.

FIG. 3 is a flow diagram illustrating a method 50 for preparing the semiconductor device structure 100, and the method 50 includes steps S51, S53, S55, S57, S59 and S61, in accordance with some embodiments. The steps S51 to S61 of FIG. 3 are first introduced briefly and then elaborated in connection with FIG. 19 or FIG. 20.

The steps S51 to S57 of FIG. 3 are similar to the steps S11 to S17 of FIG. 1. After the second energy-sensitive patterns are formed, at step S59, an energy treating process is performed to transform at least a portion of each of the second energy-sensitive patterns into a treated portion. In some embodiments, upper portions of the second energy-sensitive patterns are transformed into treated portions. In some embodiments, the second energy-sensitive patterns are fully transformed into treated portions. Moreover, in some embodiments, the energy treating process includes an e-beam writing process. However, any other suitable process, such as an ion-beam writing process, may alternatively be utilized.

Next, the step S61 is similar to the step S19 of FIG. 1. As mentioned above, the first openings and the second openings with different depths are formed in the target layer simultaneously. For example, the first openings and the second openings are formed in the same stage using the same process.

Figure 4:
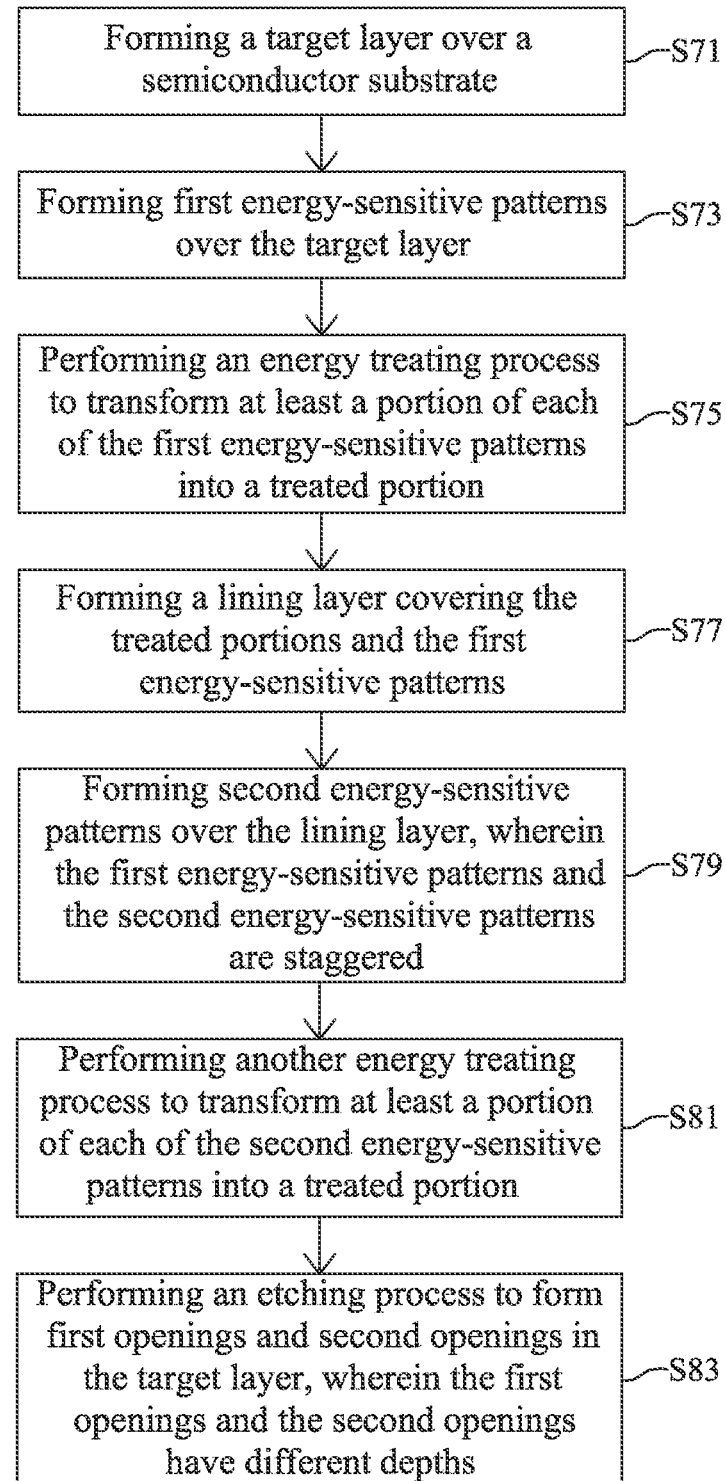
FIG. 4 is a flow diagram illustrating a method for preparing a semiconductor device structure, in accordance with some embodiments.

FIG. 4 is a flow diagram illustrating a method 70 for preparing the semiconductor device structure 100, and the method 70 includes steps S71, S73, S75, S77, S79, S81 and S83, in accordance with some embodiments. The steps S71 to S83 of FIG. 4 are first introduced briefly and then elaborated in connection with FIG. 21.

The steps S71 and S73 are similar to the steps S11 and S13 of FIG. 1. After the first energy-sensitive patterns are formed, at step S75, an energy treating process is performed to transform at least a portion of each of the first energy-sensitive patterns into a treated portion. In some embodiments, upper portions of the first energy-sensitive patterns are transformed into treated portions. In some embodiments, the first energy-sensitive patterns are fully transformed into treated portions. Moreover, in some embodiments, the energy treating process includes an e-beam writing process. However, any other suitable process, such as an ion-beam writing process, may alternatively be utilized.

Next, the step S77 is similar to the step S15 of FIG. 1. In some embodiments, the treated portions formed by the step S75 are covered by the lining layer. The step S79 for forming the second energy-sensitive patterns is similar to the step S17 of FIG. 1, and the details are not repeated. After the second energy-sensitive patterns are formed, at step S81, another energy treating process is performed to transform at least a portion of each of the second energy-sensitive patterns into a treated portion.

In some embodiments, upper portions of the second energy-sensitive patterns are transformed into treated portions. In some embodiments, the second energy-sensitive patterns are fully transformed into treated portions. Similar to the energy treating process performed on the first energy-sensitive patterns at step S75, the energy treating process performed on the second energy-sensitive patterns may include an e-beam writing process. However, any other suitable process, such as an ion-beam writing process, may alternatively be utilized.

Subsequently, the step S83 is similar to the step S19 of FIG. 1. As mentioned above, the first openings and the second openings with different depths are formed in the target layer simultaneously. For example, the first openings and the second openings are formed in the same stage using the same process.

Figure 5:
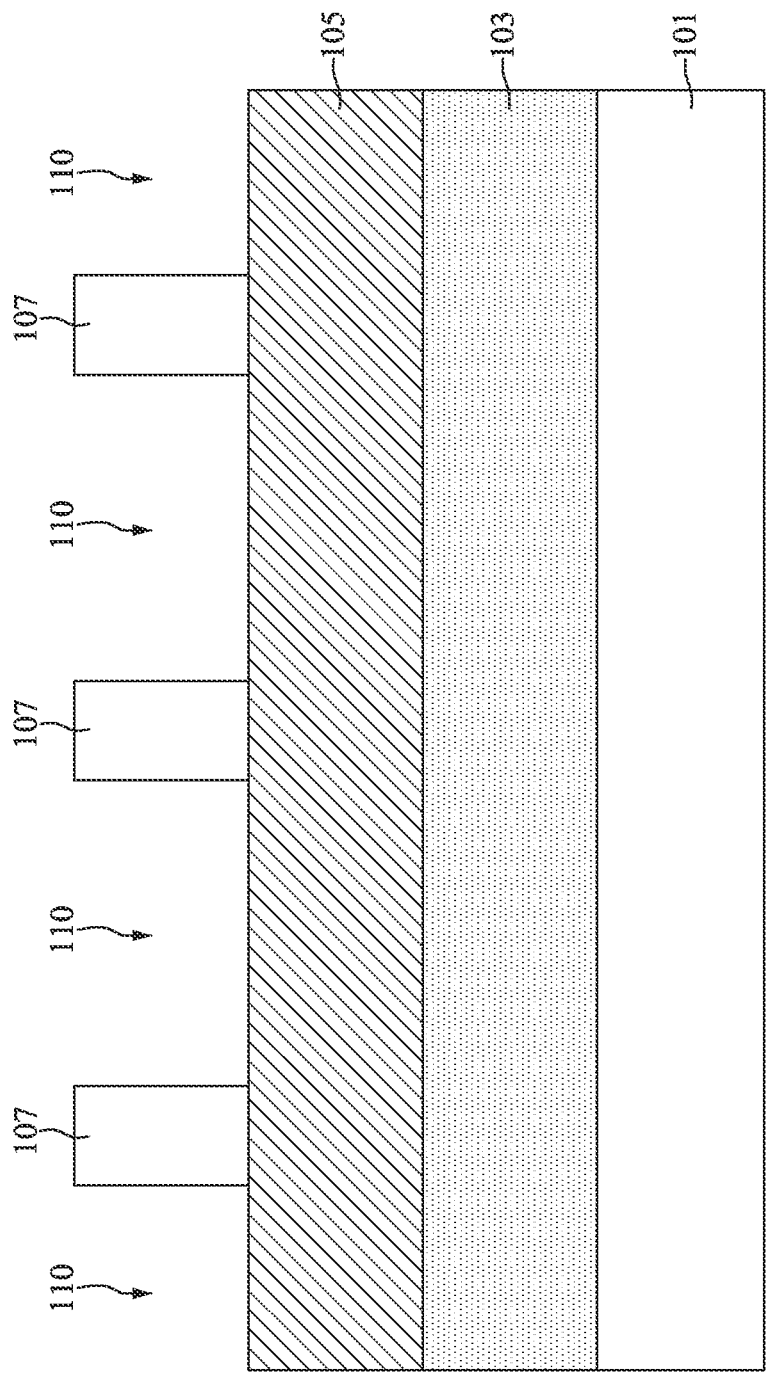
FIG. 5 is a cross-sectional view illustrating an intermediate stage of sequentially forming a target layer, an energy-sensitive layer, and a patterned hard mask over a semiconductor substrate during the formation of the semiconductor device structure, in accordance with some embodiments.

FIGS. 5-12 are cross-sectional views illustrating various stages of forming the semiconductor device structure 100 (FIG. 12) by the method 10 of FIG. 1, in accordance with some embodiments. As shown in FIG. 5, a target layer 103 is formed over a semiconductor substrate 101, in accordance with some embodiments. The respective step is illustrated as the step S11 in the method 10 shown in FIG. 1.

The semiconductor substrate 101 may be a semiconductor wafer such as a silicon wafer. Alternatively or additionally, the semiconductor substrate 101 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP.

In some embodiments, the semiconductor substrate 101 includes an epitaxial layer. For example, the semiconductor substrate 101 has an epitaxial layer overlying a bulk semiconductor. In some embodiments, the semiconductor substrate 101 is a semiconductor-on-insulator substrate which may include a substrate, a buried oxide layer over the substrate, and a semiconductor layer over the buried oxide layer, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods.

In some embodiments, the target layer 103 includes a dielectric material, such as silicon oxide, silicon nitride, silicon oxynitride, a low-k dielectric material or another suitable material. However, any suitable materials may be utilized. In some embodiments, the target layer 103 is formed by a deposition process, such as a chemical vapor deposition (CVD) process, a physical vapor deposition (PVD) process, an atomic layer deposition (ALD) process, a spin-on coating process, or another suitable method.

Still referring to FIG. 5, an energy-sensitive layer 105 is formed over the target layer 103, and a patterned hard mask 107 with openings 110 is formed over the energy-sensitive layer 105, in accordance with some embodiments. In some embodiments, the energy-sensitive layer 105 includes a cross-linking compound having a cross-linking functional group. In some embodiments, the cross-linking functional group includes a double bond. In some embodiments, the cross-linking compound has a hydrogen-bonding group, a polymerizable diacetylene group, or a combination thereof. Similar to the method for forming the target layer 103, the energy-sensitive layer 105 may be formed by a deposition process, such as a CVD process, a PVD process, an ALD process, a spin-on coating process, or another suitable method.

In addition, the patterned hard mask 107 may be formed by a procedure including deposition and patterning. In some embodiments, the patterned hard mask 107 includes openings 110 exposing the energy-sensitive layer 105, and the patterned hard mask 107 functions as a mask for a subsequent etching process. In some embodiments, the patterned hard mask 107 includes silicon oxide, silicon nitride, silicon oxynitride, silicon oxycarbide, silicon carbon nitride, metal oxide, or another suitable material. In some embodiments, the patterned hard mask 107 is selected to have a lower etch rate than the energy-sensitive layer 105.

Figure 6:
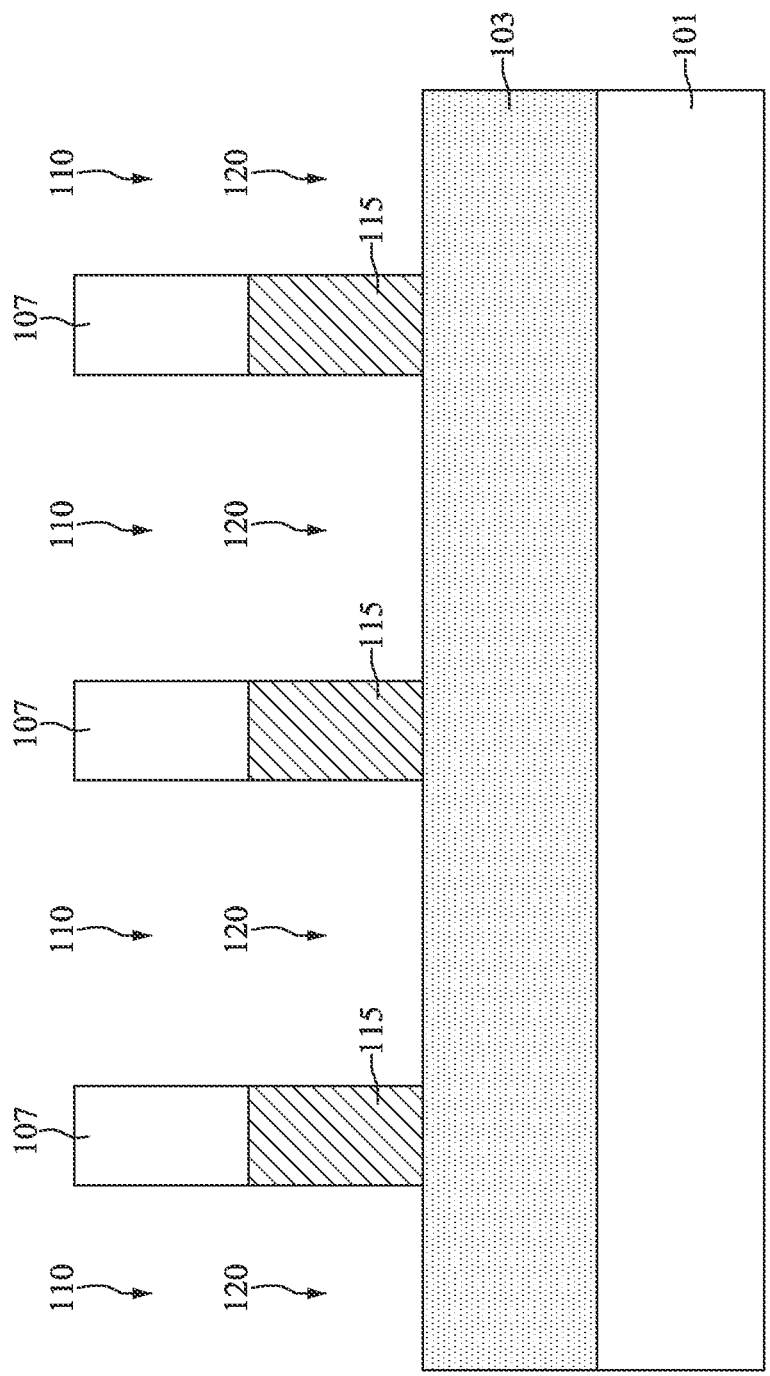
FIG. 6 is a cross-sectional view illustrating an intermediate stage of etching the energy-sensitive layer using the patterned hard mask as a mask such that first energy-sensitive patterns are formed, in accordance with some embodiments.

Subsequently, an etching process is performed on the energy-sensitive layer 105 using the patterned hard mask 107 as a mask, such that first energy-sensitive patterns 115 and openings 120 are formed, as shown in FIG. 6 in accordance with some embodiments. The respective step is illustrated as the step S13 in the method 10 shown in FIG. 1. In some embodiments, the first energy-sensitive patterns 115 are separated from each other by the openings 120, and the target layer 103 is exposed by the openings 120. The etching process may be a wet etching process, a dry etching process, or a combination thereof.

Figure 7:
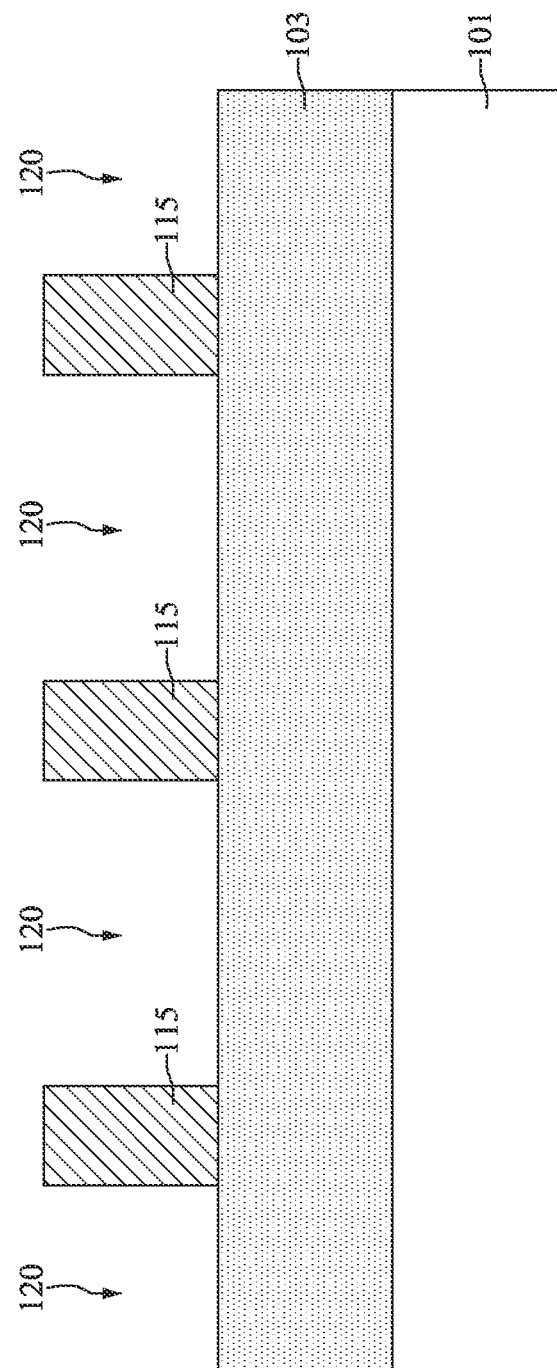
FIG. 7 is a cross-sectional view illustrating an intermediate stage of removing the patterned hard mask, in accordance with some embodiments.

After the openings 120 are formed between the first energy-sensitive patterns 115, the patterned hard mask 107 is removed, as shown in FIG. 7 in accordance with some embodiments. In some embodiments, the patterned hard mask 107 is removed by a stripping process, an ashing process, an etching process, or another suitable process.

Figure 8:
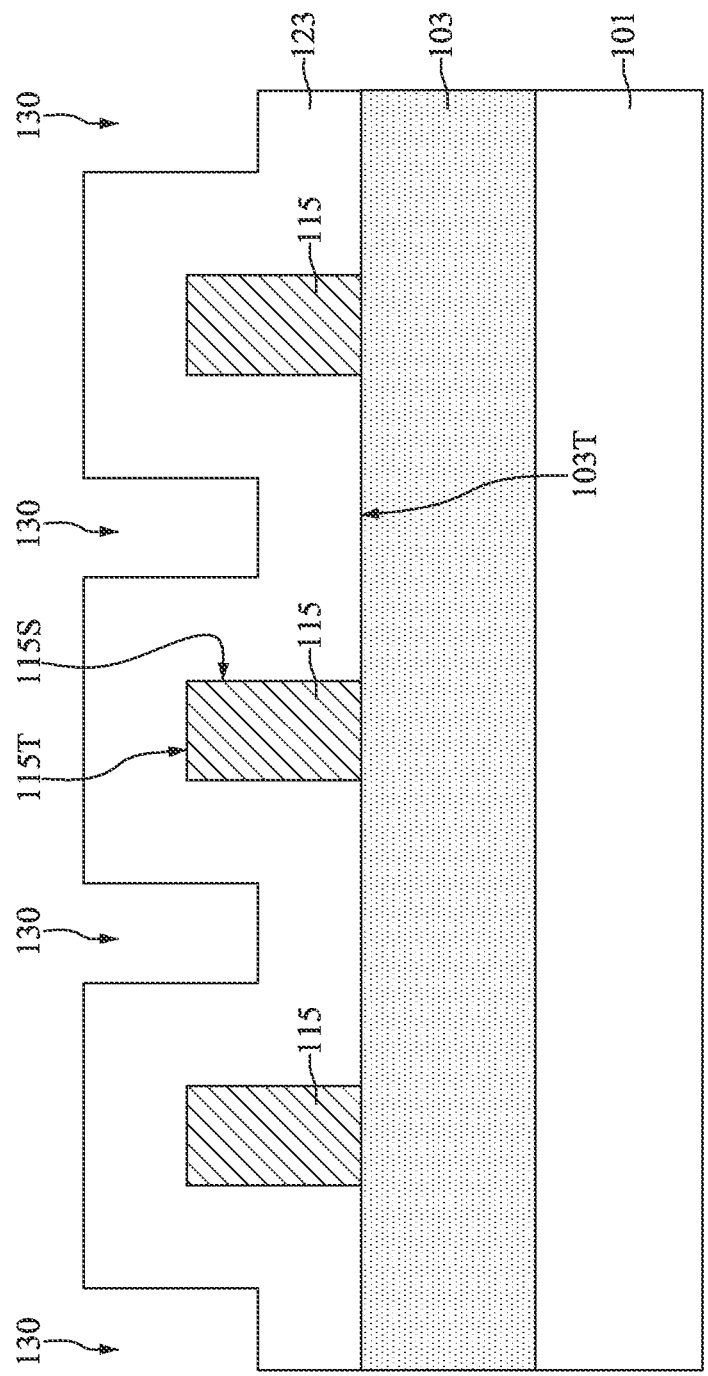
FIG. 8 is a cross-sectional view illustrating an intermediate stage of forming a lining layer covering the first energy-sensitive patterns, in accordance with some embodiments.

Then, a lining layer 123 is formed conformally covering the first energy-sensitive patterns 115 and the target layer 103, as shown in FIG. 8 in accordance with some embodiments. The respective step is illustrated as the step S15 in the method 10 shown in FIG. 1. In some embodiments, openings 130 are formed over the lining layer 123 and between the first energy-sensitive patterns 115.

In some embodiments, the sidewalls 115S and the top surfaces 115T of the first energy-sensitive patterns 115, and the top surface 103T of the target layer 103 exposed by the openings 120 (see FIG. 7) are covered by the lining layer 123. In some embodiments, the lining layer 123 includes an organic polymer material, such as resin, benzocyclobutene (BCB) or another suitable material. In some embodiments, the lining layer 123 is formed by a deposition process, such as a CVD process, a PVD process, an ALD process, or another suitable method.

Figure 9:
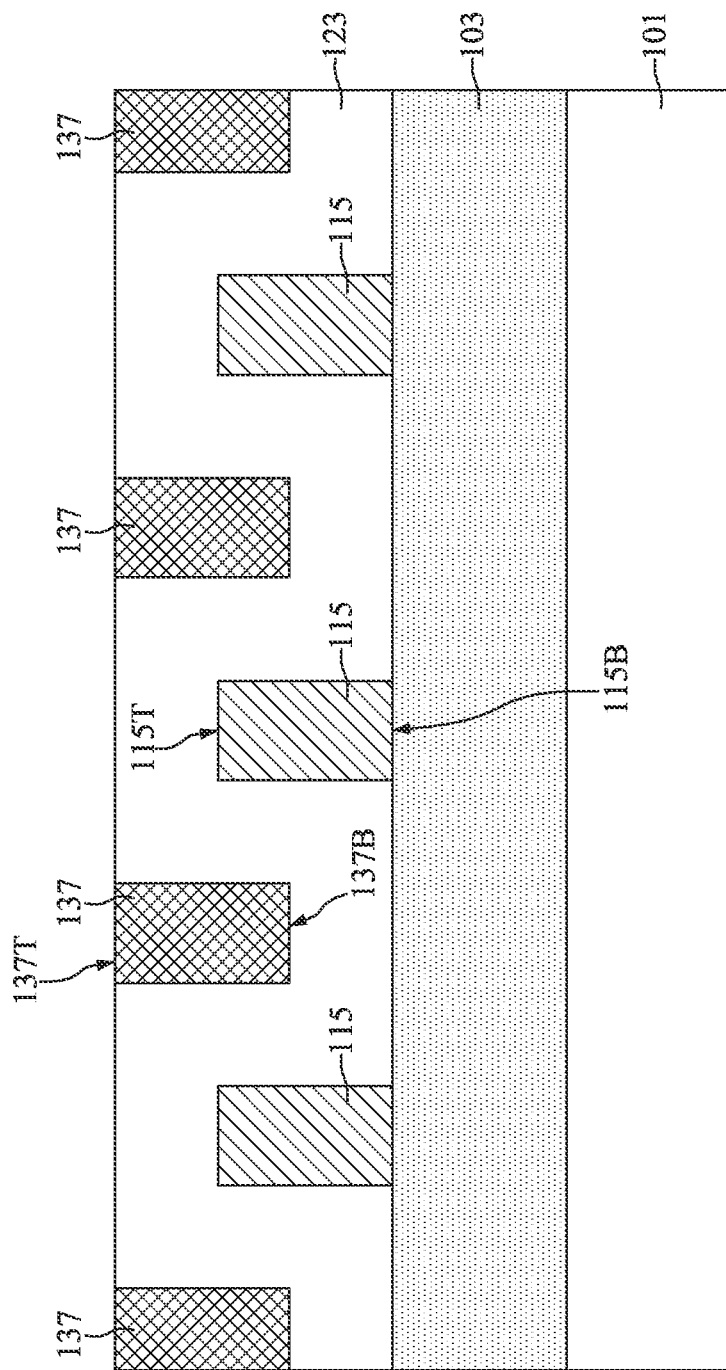
FIG. 9 is a cross-sectional view illustrating an intermediate stage of forming second energy-sensitive patterns over the lining layer, in accordance with some embodiments.

Next, second energy-sensitive patterns 137 are formed over the lining layer 123, as shown in FIG. 9 in accordance with some embodiments. In some embodiments, the openings 130 over the lining layer 123 and between the first energy-sensitive patterns 115 are filled by the second energy-sensitive patterns 137. In some embodiments, the first energy-sensitive patterns 115 and the second energy-sensitive patterns 137 are in a staggered arrangement. The respective step is illustrated as the step S17 in the method 10 shown in FIG. 1.

Some materials used to form the second energy-sensitive patterns 137 may be similar to, or the same as, those used to form the first energy-sensitive patterns 115 and are not repeated herein. In the present embodiment, the first energy-sensitive patterns 115 and the second energy-sensitive patterns 137 are made of different materials. In some embodiments, the second energy-sensitive patterns 137 are formed by a deposition process and a subsequent planarization process. For example, an energy-sensitive layer (not shown) is formed covering the structure of FIG. 8, and the energy-sensitive layer is planarized until the lining layer 123 is exposed. The planarization process may include a grinding process, a chemical mechanical polishing (CMP) process, an etching process, or a combination thereof.

In some embodiments, the bottom surfaces 137B of the second energy-sensitive patterns 137 are higher than the bottom surfaces 115B of the first energy-sensitive patterns 115. In some embodiments, the top surfaces 137T of the second energy-sensitive patterns 137 are higher than the top surface 115T of the first energy-sensitive patterns 115. In some embodiments, the top surface 115T of the first energy-sensitive patterns 115 are higher than the bottom surfaces 137B of the second energy-sensitive patterns 137.

Figure 10:
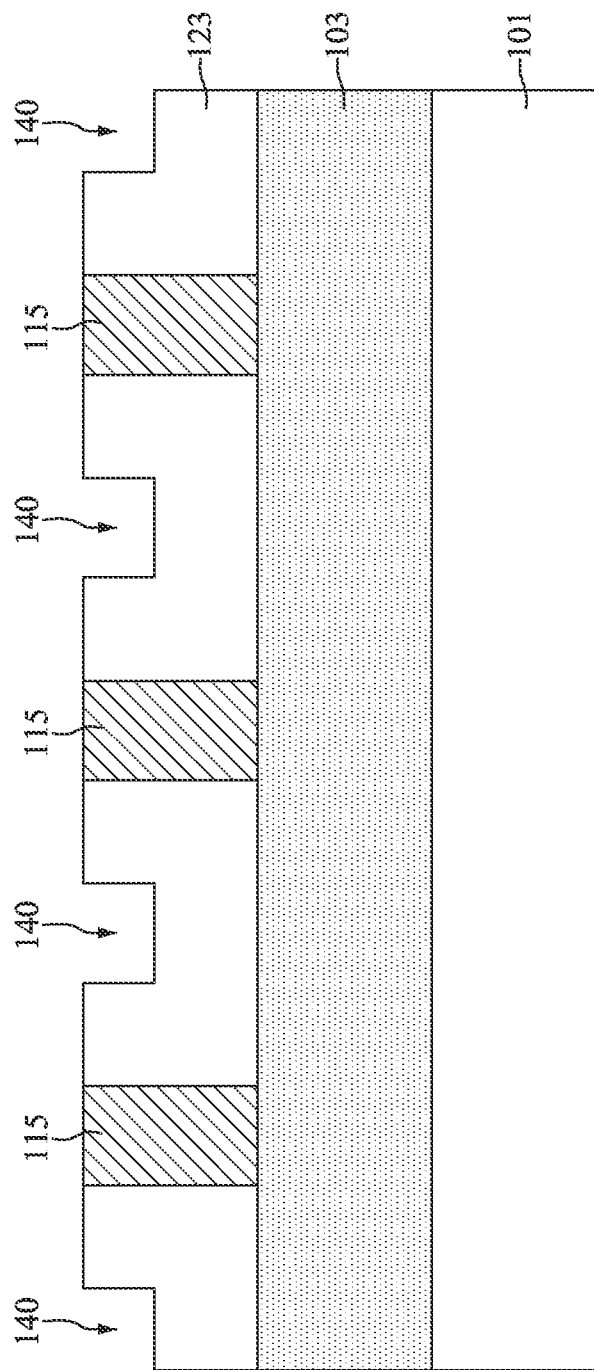
FIGS. 10-12 are cross-sectional views illustrating intermediate stages of performing an etching process to form openings in the target layer, in accordance with some embodiments.
Figure 11:
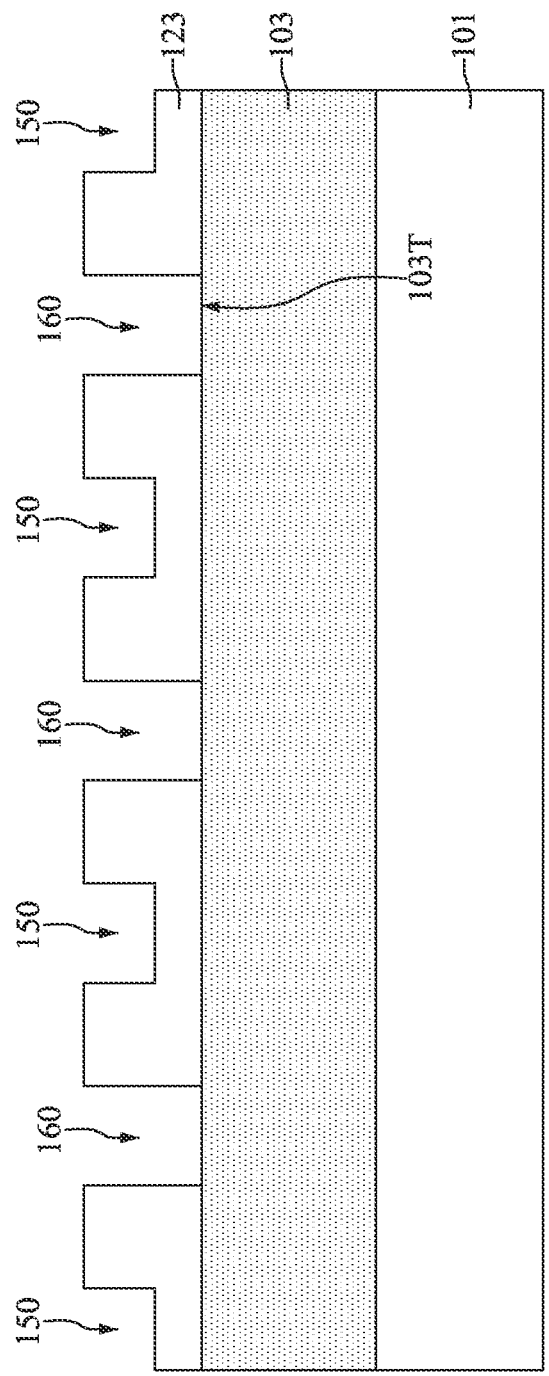
Figure 12:
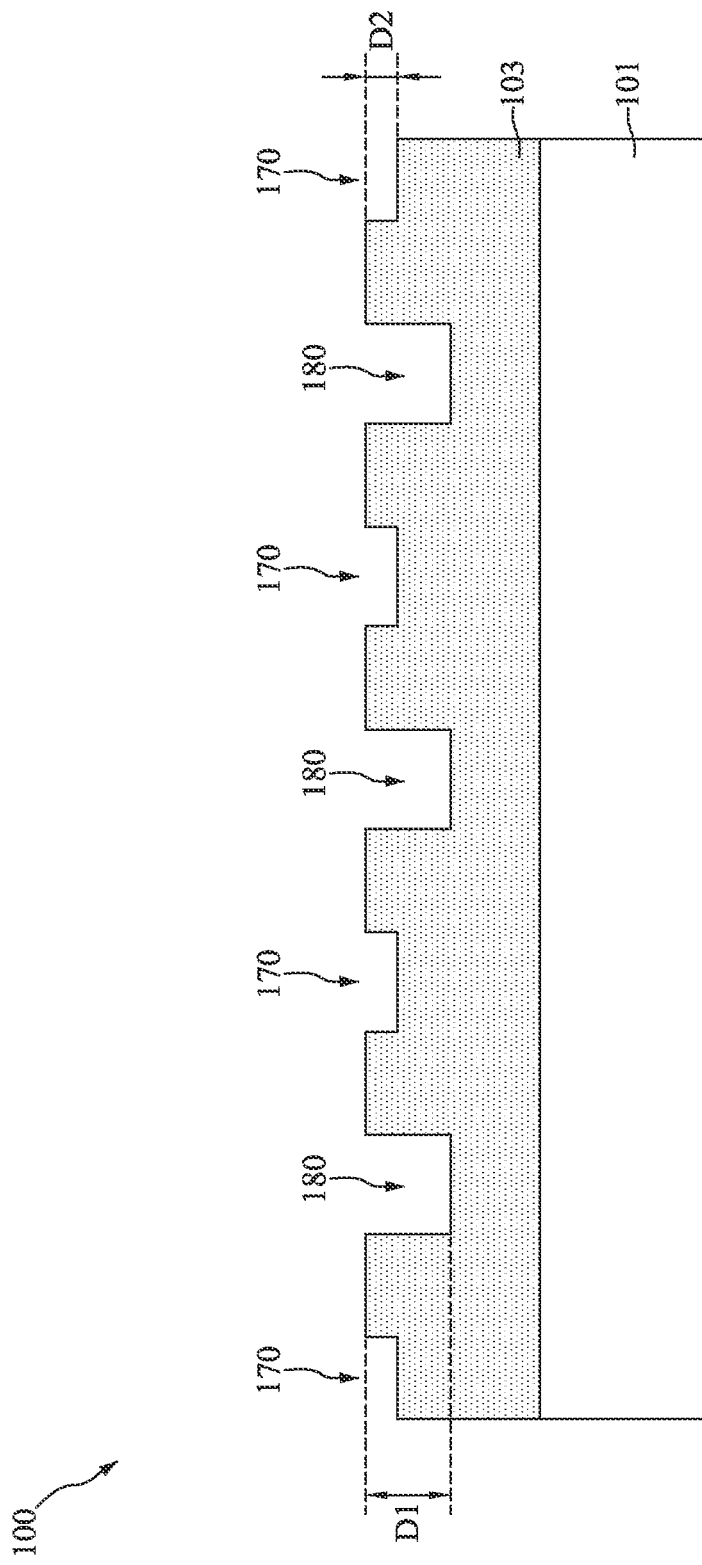

Subsequently, an etching process is performed to form first openings 180 and second openings 170 in the target layer 103, as shown in FIGS. 10-12 in accordance with some embodiments. The respective step is illustrated as the step S19 in the method 10 shown in FIG. 1. FIGS. 10-12 respectively show different stages in the etching process, in accordance with some embodiments.

In some embodiments, during the etching process, the etching rate of the first energy-sensitive patterns 115 and the etching rate of the second energy-sensitive patterns 137 are each greater than the etching rate of the lining layer 123, and the etching rate of the first energy-sensitive patterns 115 is different from the etching rate of the second energy-sensitive patterns 137 since they are made of different materials. In the present embodiment, the etching rate of the first energy-sensitive patterns 115 is greater than the etching rate of the second energy-sensitive patterns 137, but the disclosure is not limited thereto. In an alternative embodiment, the etching rate of the second energy-sensitive patterns 137 is greater than the etching rate of the first energy-sensitive patterns 115.

As shown in FIG. 10, during the first stage of the etching process, since the etching rate of the second energy-sensitive patterns 137 is higher than the etching rate of the lining layer 123, openings 140 are formed between each two adjacent ones of the first energy-sensitive patterns 115, in accordance with some embodiments. Then, during the second stage of the etching process, the openings 140 are deepened to form openings 150, and the first energy-sensitive patterns 115 are etched to form openings 160, as shown in FIG. 11 in accordance with some embodiments.

In some embodiments, since the etching rate of the first energy-sensitive patterns 115 is greater than the etching rate of the lining layer 123, the bottom surfaces of the openings 150 are higher than the bottom surfaces of the openings 160. In some embodiments, the openings 160 reach to the target layer 103. For example, the top surface 103T of the target layer 103 is partially exposed by the openings 160, but not exposed by the openings 150.

Next, during the final stage of the etching process, the openings 160 and 150 are deepened to form first openings 180 and second openings 170 in the target layer 103, as shown in FIG. 12 in accordance with some embodiments. Since the etching rates of the first energy-sensitive patterns 115 and the second energy-sensitive patterns 137 are different, the openings 170 and 180 have different depths. For example, each of the first openings 180 has a first depth D1, the first depths are substantially the same, each of the second openings 170 has a second depth D2, the second depths are substantially the same, and the second depths D2 are different from the first depths D1.

As mentioned above, since the etching rate of the first energy-sensitive patterns 115 is greater than the etching rate of the second energy-sensitive patterns 137 in the present embodiment, the first depths D1 of the first openings 180 are greater than the second depths D2 of the second openings 170. However, in an alternative embodiment, the second depths D2 of the second openings 170 are greater than the first depths D1 of the first openings 180 since the etching rate of the second energy-sensitive patterns 137 is greater than the etching rate of the first energy-sensitive patterns 115. After the first openings 180 and the second openings 170 are formed in the target layer 103, the semiconductor device structure 100 is obtained.

Figure 13:
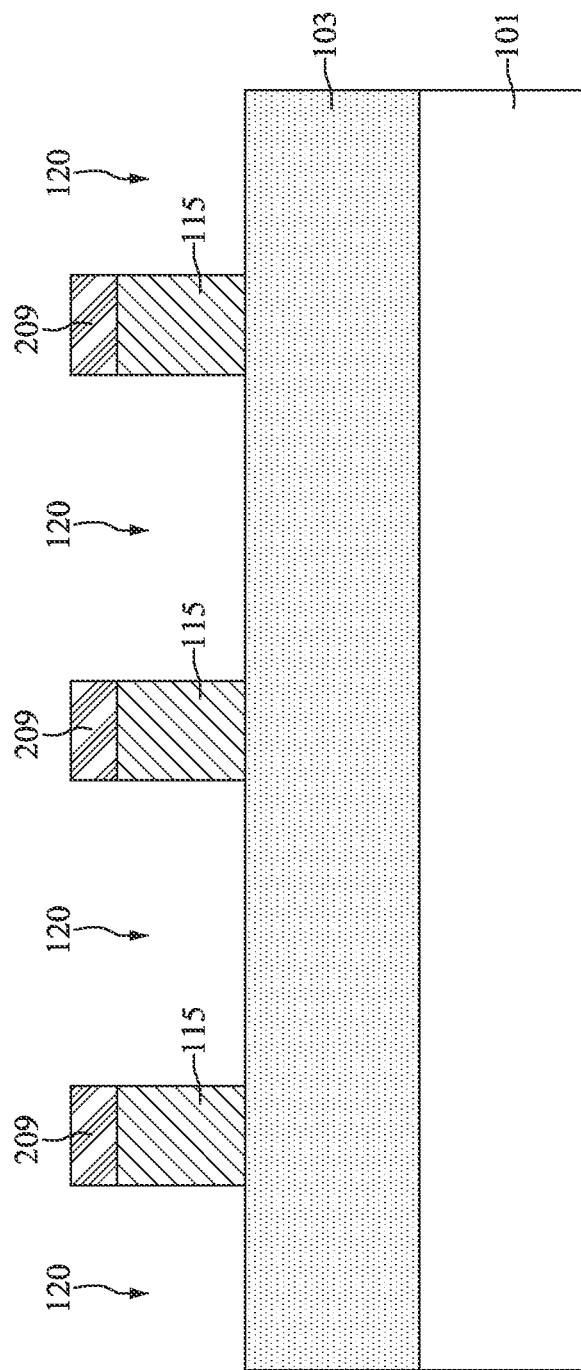
FIG. 13 is a cross-sectional view illustrating an intermediate stage of performing an energy treating process to transform upper portions of the first energy-sensitive patterns into treated portions, in accordance with some embodiments.
Figure 14:
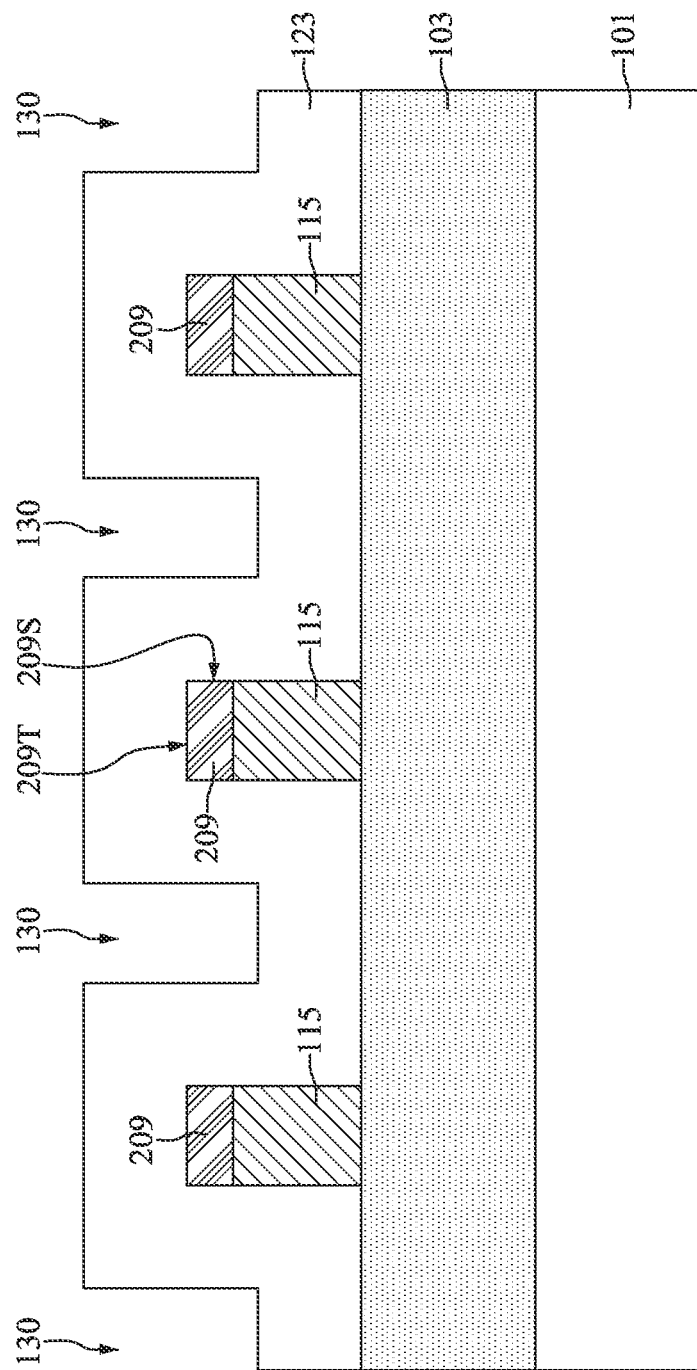
FIG. 14 is a cross-sectional view illustrating an intermediate stage of forming a lining layer covering the first energy-sensitive patterns and the treated portions, in accordance with some embodiments.
Figure 15:
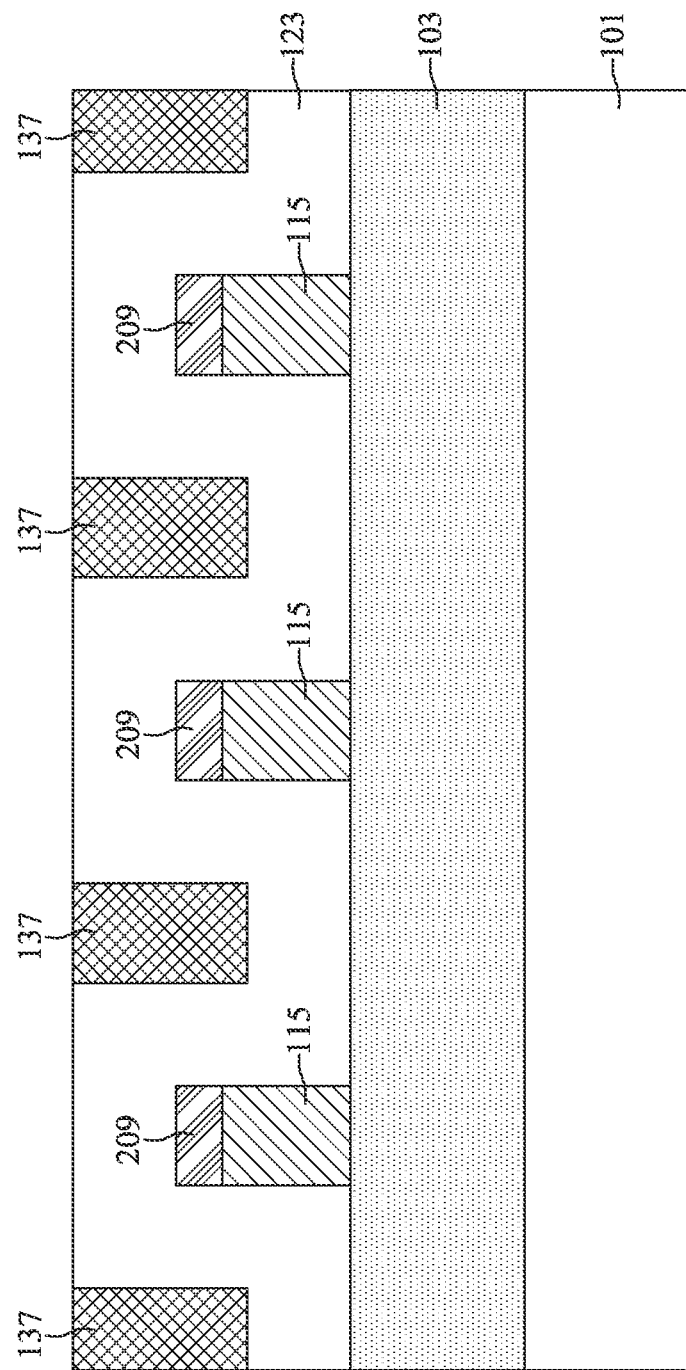
FIG. 15 is a cross-sectional view illustrating an intermediate stage of forming second energy-sensitive patterns over the lining layer, in accordance with some embodiments.

FIGS. 13-15 are cross-sectional views illustrating various stages of forming the semiconductor device structure 100 (FIG. 12) by the method 30 of FIG. 2, in accordance with some embodiments. As shown in FIG. 13, after the target layer 103 and the first energy-sensitive patterns 115 are formed (corresponding to the steps S31 and S33 of FIG. 2, and the details have been discussed in the embodiments referring to FIGS. 5-7), an energy treating process is performed such that the upper portions of the first energy-sensitive patterns 115 are transformed into treated portions 209, in accordance with some embodiments. The respective step is illustrated as the step S35 in the method 30 shown in FIG. 2.

In some embodiments, the energy treating process includes an e-beam writing process, an ion beam writing process, or another suitable process. Moreover, in some embodiments, the energy source of the energy treating process includes e-beam, ion beam, visible light, ultraviolet (UV), deep ultraviolet (DUV), extreme ultraviolet (EUV), X-ray, or another suitable energy source.

Subsequently, the lining layer 123 is formed conformally covering the first energy-sensitive patterns 115, the treated portions 209, and the target layer 103, as shown in FIG. 14 in accordance with some embodiments. The respective step is illustrated as the step S37 in the method 30 shown in FIG. 2. In some embodiments, the top surfaces 209T and the sidewalls 209S of the treated portions 209 are covered by the lining layer 123. In some embodiments, the openings 130 are formed over the lining layer 123 and between any two adjacent ones of the first energy-sensitive patterns 115 (or any two adjacent ones of the treated portions 209). The details of the lining layer 123 are substantially the same as in FIG. 8, and hence are not repeated herein.

Then, the second energy-sensitive patterns 137 are formed over the lining layer 123, as shown in FIG. 15 in accordance with some embodiments. The respective step is illustrated as the step S39 in the method 30 shown in FIG. 2. In some embodiments, the openings 130 are filled by the second energy-sensitive patterns 137. In some embodiments, the first energy-sensitive patterns 115 (or the treated portions 209) and the second energy-sensitive patterns 137 are in a staggered arrangement.

The details of the second energy-sensitive patterns 137 are substantially the same as in FIG. 9, and hence are not repeated herein. In the present embodiment, the materials of the first energy-sensitive patterns 115 (i.e., the materials of the untreated portions of the first energy-sensitive patterns 115) and the second energy-sensitive patterns 137 are substantially the same.

After the second energy-sensitive patterns 137 are formed, an etching process is performed in multiple stages using the processes as described above (see FIGS. 10-12), which are not repeated. In some embodiments, during the etching process, the etching rate of the treated portions 209 is different from the etching rates of the first energy-sensitive patterns 115 and the second energy-sensitive patterns 137. In the present embodiment, the etching rate of the treated portions 209 is greater than the etching rates of the first energy-sensitive patterns 115 and the second energy-sensitive patterns 137, but the disclosure is not limited thereto. In an alternative embodiment, the etching rate of the treated portions 209 is less than the etching rates of the first energy-sensitive patterns 115 and the second energy-sensitive patterns 137.

After the etching process is performed, the first openings 180 and the second openings 170 are formed in the target layer 103, as shown in FIG. 12 in accordance with some embodiments. The details of the openings in the target layer 103 are not repeated. The respective step is illustrated as the step S41 in the method 30 shown in FIG. 2. After the first openings 180 and the second openings 170 are formed, the semiconductor device structure 100 is obtained.

Figure 16:
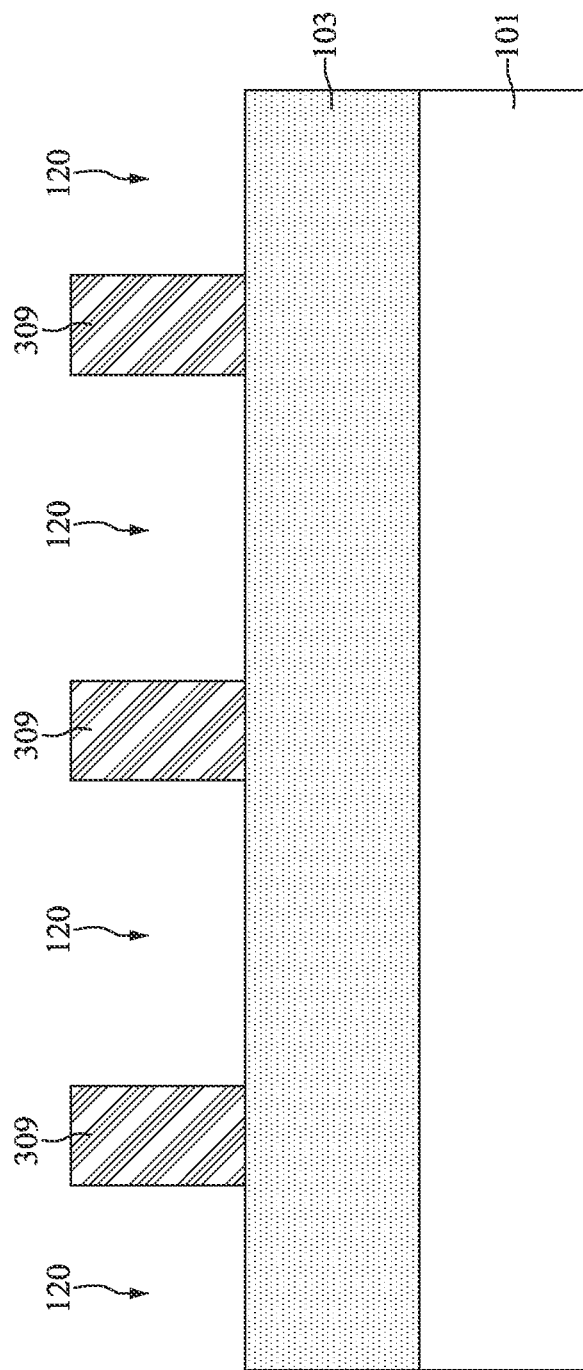
FIG. 16 is a cross-sectional view illustrating an intermediate stage of performing an energy treating process to transform the first energy-sensitive patterns into treated portions, in accordance with some embodiments.
Figure 17:
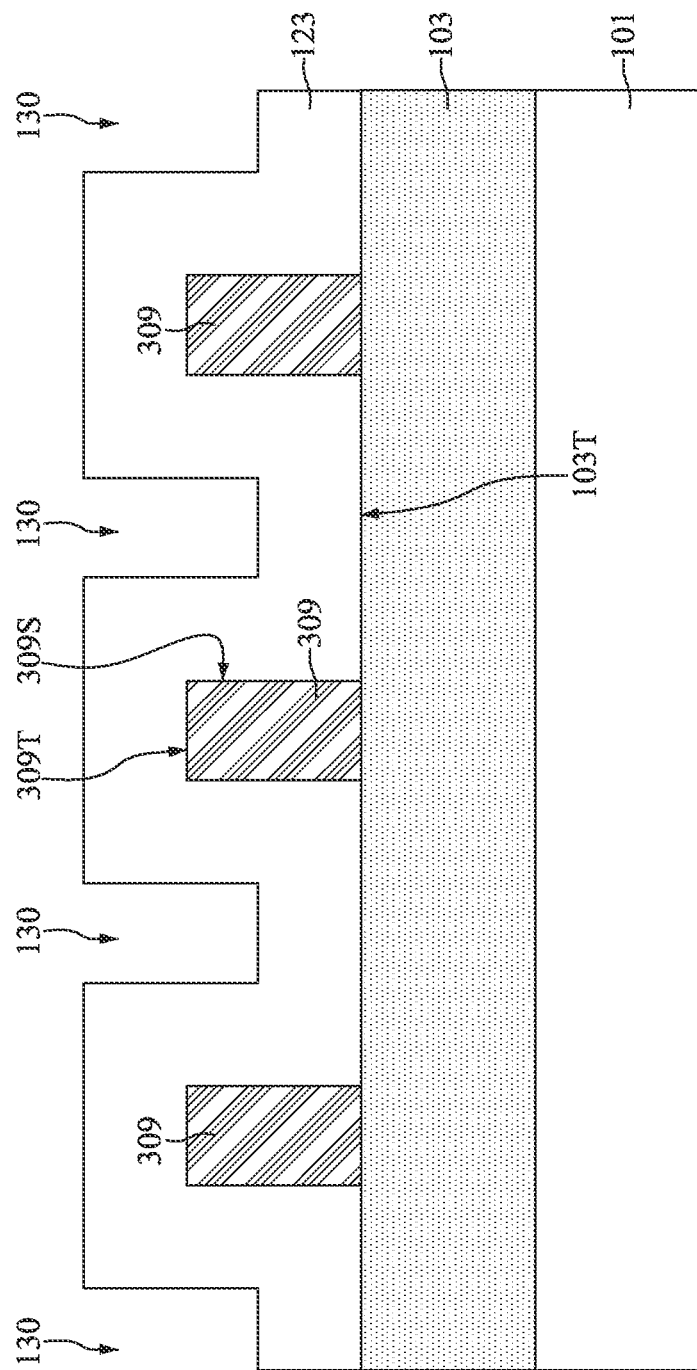
FIG. 17 is a cross-sectional view illustrating an intermediate stage of forming a lining layer covering the treated portions, in accordance with some embodiments.
Figure 18:
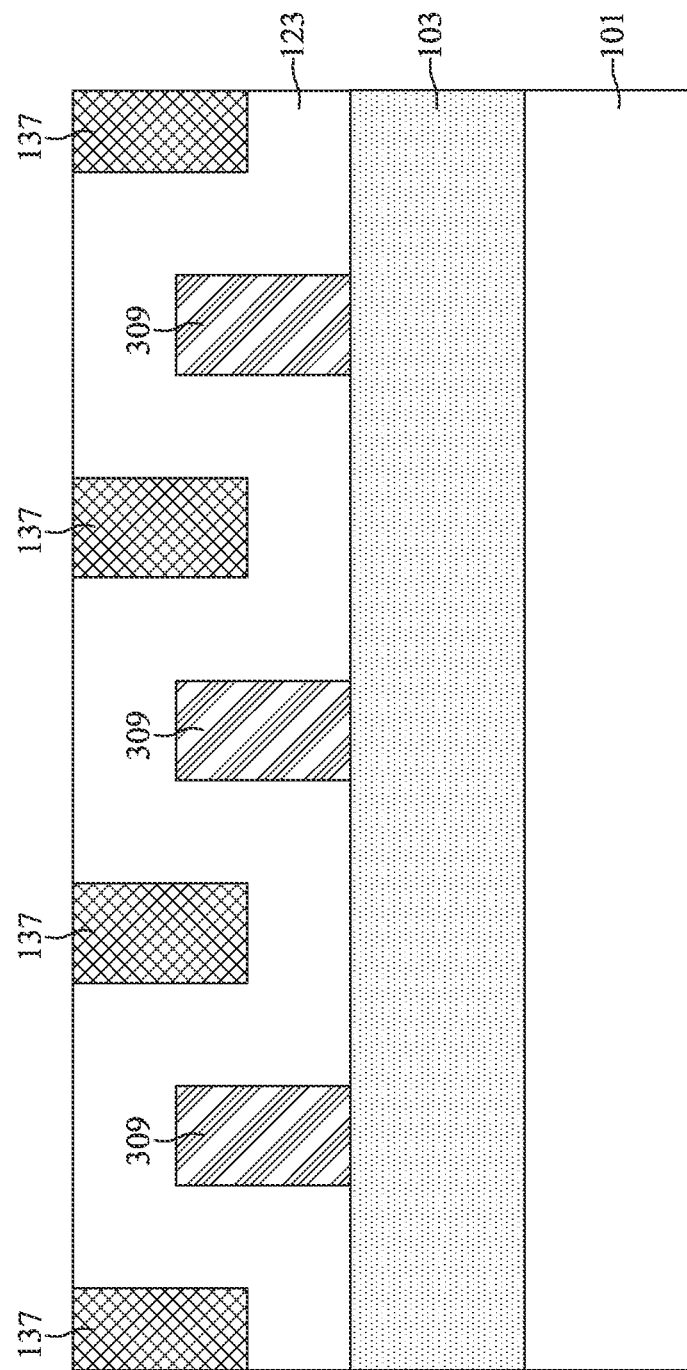
FIG. 18 is a cross-sectional view illustrating an intermediate stage of forming second energy-sensitive patterns over the lining layer, in accordance with some embodiments.

FIGS. 16-18 are cross-sectional views illustrating various stages of forming the semiconductor device structure 100 (FIG. 12) by the method 30 of FIG. 2, in accordance with some alternative embodiments. The method described in FIGS. 16-18 are similar to, or the same as the method described in FIGS. 13-15, except that the first energy-sensitive patterns 115 are fully transformed into treated portions 309. In other words, there is no untreated portion of the first energy-sensitive patterns 115 remains after the energy treating process is performed.

Similar to the step shown in FIG. 13, after the target layer 103 and the first energy-sensitive patterns 115 are formed (corresponding to the steps S31 and S33 of FIG. 2, and the detail have been discussed in the embodiments referring to FIGS. 5-7), an energy treating process is performed such that the first energy-sensitive patterns 115 are fully transformed into treated portions 309, as shown in FIG. 16 in accordance with some embodiments. The respective step is illustrated as the step S35 in the method 30 shown in FIG. 2.

After the treated portions 309 are formed, the lining layer 123 is formed conformally covering the top surfaces 309T and the sidewalls 309S of the treated portions 309 and the top surface 103T of the target layer 103, as shown in FIG. 17 in accordance with some embodiments. The respective step is illustrated as the step S37 in the method 30 shown in FIG. 2. Then, the second energy-sensitive patterns 137 are formed over the lining layer 123, as shown in FIG. 18 in accordance with some embodiments. The respective step is illustrated as the step S39 in the method 30 shown in FIG. 2. In some embodiments, the treated portions 309 (transformed from the first energy-sensitive patterns 115) and the second energy-sensitive patterns 137 are in a staggered arrangement.

In the present embodiment, the materials of the first energy-sensitive patterns 115 (i.e., the materials of the first energy-sensitive patterns 115 before they are treated) and the second energy-sensitive patterns 137 are substantially the same. After the second energy-sensitive patterns 137 are formed, an etching process is performed in multiple stages using the processes as described above (see FIGS. 10-12), which are not repeated. In some embodiments, during the etching process, the etching rate of the treated portions 309 is different from the etching rate of the second energy-sensitive patterns 137. In the present embodiment, the etching rate of the treated portions 309 is greater than the etching rate of the second energy-sensitive patterns 137, but the disclosure is not limited thereto. In an alternative embodiment, the etching rate of the treated portions 309 is less than the etching rate of the second energy-sensitive patterns 137.

After the etching process is performed, the first openings 180 and the second openings 170 are formed in the target layer 103, as shown in FIG. 12 in accordance with some embodiments. The details of the openings in the target layer 103 are not repeated. The respective step is illustrated as the step S41 in the method 30 shown in FIG. 2. After the first openings 180 and the second openings 170 are formed in the target layer 103, the semiconductor device structure 100 is obtained.

Figure 19:
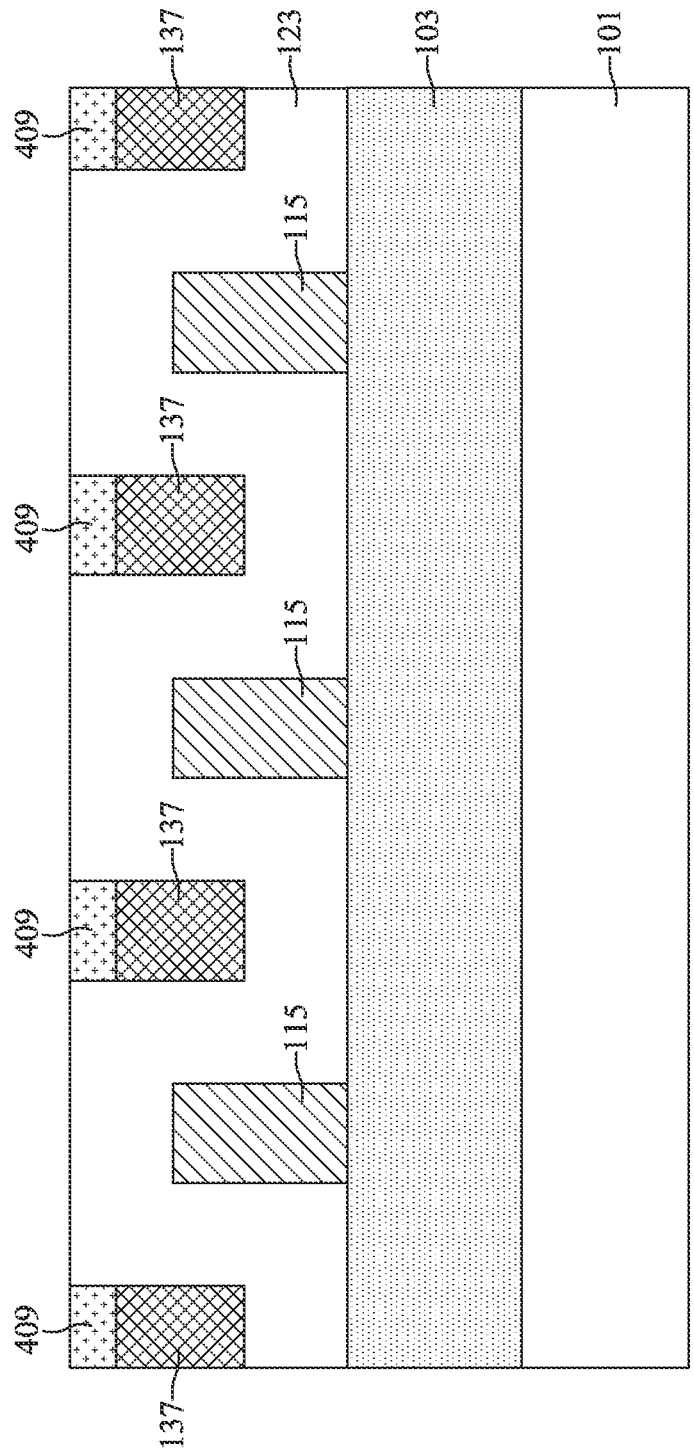
FIG. 19 is a cross-sectional view illustrating an intermediate stage of performing an energy treating process to transform upper portions of the second energy-sensitive patterns into treated portions, in accordance with some embodiments.

FIG. 19 is a cross-sectional view illustrating an intermediate stage of forming the semiconductor device structure 100 (FIG. 12) by the method 50 of FIG. 3, in accordance with some embodiments. As shown in FIG. 19, the target layer 103, the first energy-sensitive patterns 115, the lining layer 123, and the second energy-sensitive patterns 137 are formed corresponding to the steps S51 to S57 of FIG. 3, and the details have been discussed in the embodiments referring to FIGS. 5-9. In the present embodiment, the materials of the first energy-sensitive patterns 115 and the second energy-sensitive patterns 137 are substantially the same.

Subsequently, an energy treating process is performed on the second energy-sensitive patterns 137 such that the upper portions of the second energy-sensitive patterns 137 are transformed into treated portions 409, in accordance with some embodiments. The respective step is illustrated as the step S59 in the method 50 shown in FIG. 3. In some embodiments, the energy treating process includes an e-beam writing process, an ion beam writing process, or another suitable process. In addition, in some embodiments, the energy source of the energy treating process includes e-beam, ion beam, visible light, UV, DUV, EUV, X-ray, or another suitable energy source.

After the treated portions 409 are formed, an etching process is performed in multiple stages using the processes as described above (see FIGS. 10-12), which are not repeated. In some embodiments, during the etching process, the etching rate of the treated portions 409 is different from the etching rates of the first energy-sensitive patterns 115 and the second energy-sensitive patterns 137. In the present embodiment, the etching rate of the treated portions 409 is less than the etching rate of the first energy-sensitive patterns 115 and the etching rate of the second energy-sensitive patterns 137 (i.e., the etching rate of the untreated portions of the second energy-sensitive patterns 137), but the disclosure is not limited thereto. In an alternative embodiment, the etching rate of the treated portions 409 is greater than the etching rate of the first energy-sensitive patterns 115 and the etching rate of the second energy-sensitive patterns 137.

After the etching process is performed, the first openings 180 and the second openings 170 are formed in the target layer 103, as shown in FIG. 12 in accordance with some embodiments. The details of the openings in the target layer 103 are not repeated. The respective step is illustrated as the step S61 in the method 50 shown in FIG. 3. After the first openings 180 and the second openings 170 are formed, the semiconductor device structure 100 is obtained.

Figure 20:
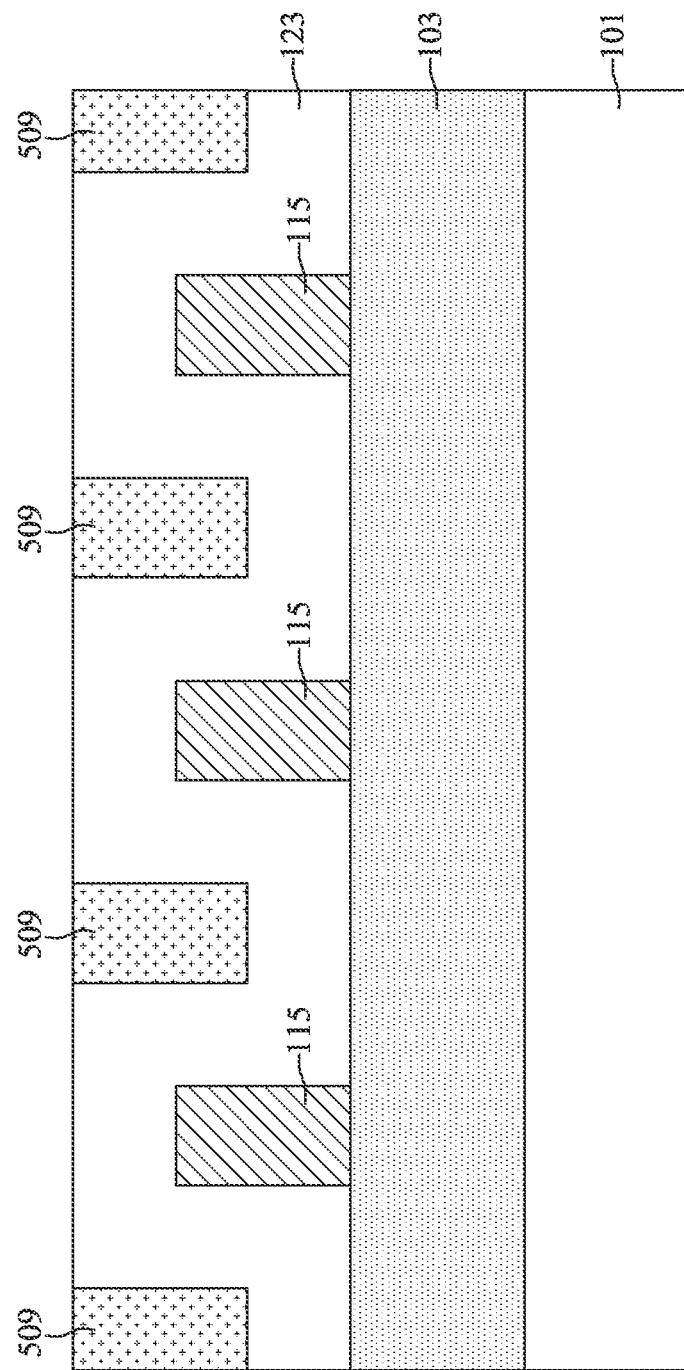
FIG. 20 is a cross-sectional view illustrating an intermediate stage of performing an energy treating process to transform the second energy-sensitive patterns into treated portions, in accordance with some embodiments.

FIG. 20 is a cross-sectional view illustrating an intermediate stage of forming the semiconductor device structure 100 (FIG. 12) by the method 50 of FIG. 3, in accordance with some alternative embodiments. The method described in FIG. 20 is similar to, or the same as the method described in FIG. 19, except that the second energy-sensitive patterns 137 are fully transformed into treated portions 509. In other words, there is no untreated portion remains in the second energy-sensitive patterns 137 after the energy treating process is performed, in accordance with some embodiments.

As shown in FIG. 20, the target layer 103, the first energy-sensitive patterns 115, the lining layer 123, and the second energy-sensitive patterns 137 are formed corresponding to the steps S51 to S57 of FIG. 3, and the details have been discussed in the embodiments referring to FIGS. 5-9. In the present embodiment, the materials of the first energy-sensitive patterns 115 and the second energy-sensitive patterns 137 (i.e., the materials of the second energy-sensitive patterns 137 before they are treated) are substantially the same.

Next, an energy treating process is performed such that the second energy-sensitive patterns 137 are fully transformed into treated portions 509, in accordance with some embodiments. The respective step is illustrated as the step S59 in the method 50 shown in FIG. 3. After the treated portions 509 are formed, an etching process is performed in multiple stages using the processes as described above (see FIGS. 10-12), which are not repeated.

In some embodiments, during the etching process, the etching rate of the treated portions 509 is different from the etching rate of the first energy-sensitive patterns 115. In the present embodiment, the etching rate of the treated portions 509 is less than the etching rate of the first energy-sensitive patterns 115, but the disclosure is not limited thereto. In an alternative embodiment, the etching rate of the treated portions 509 is greater than the etching rate of the first energy-sensitive patterns 115.

After the etching process is performed, the first openings 180 and the second openings 170 are formed in the target layer 103, as shown in FIG. 12 in accordance with some embodiments. The details of the openings in the target layer 103 are not repeated. The respective step is illustrated as the step S61 in the method 50 shown in FIG. 3. After the first openings 180 and the second openings 170 are formed, the semiconductor device structure 100 is obtained.

Figure 21:
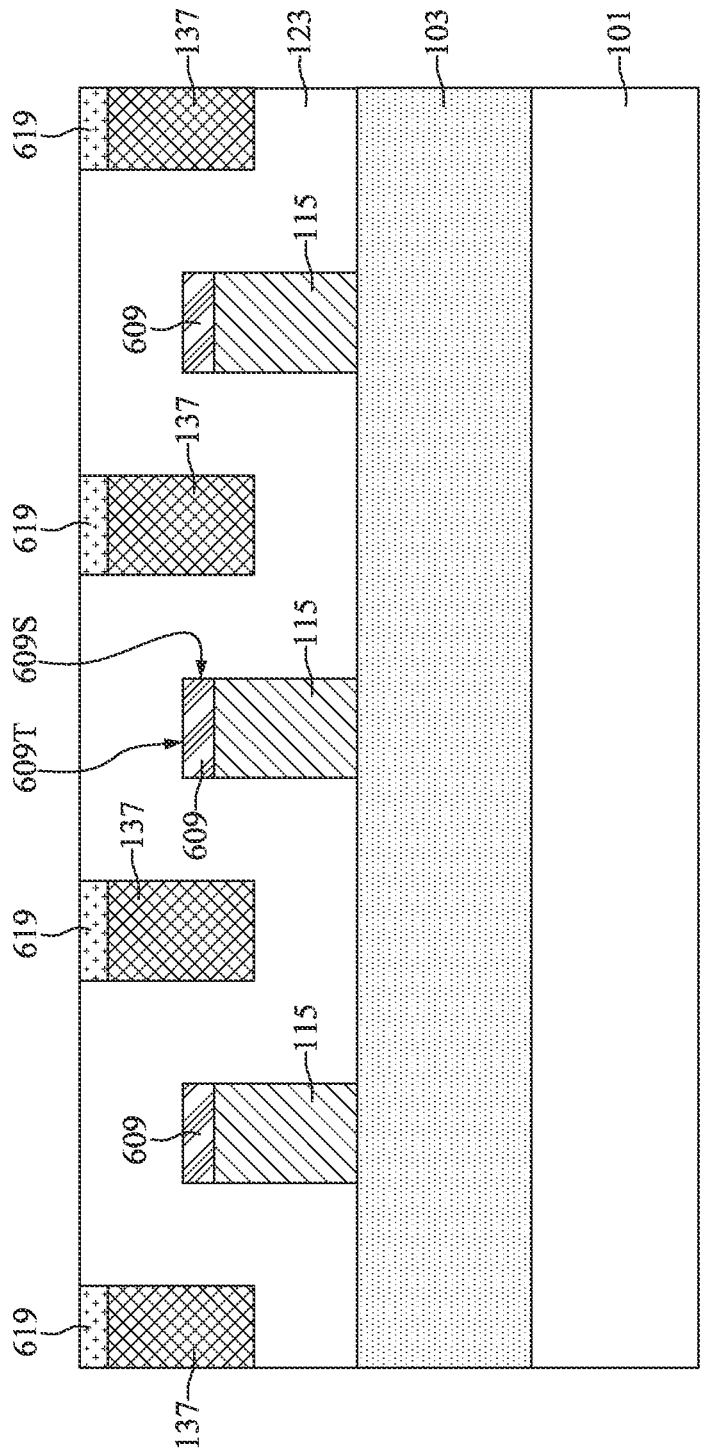
FIG. 21 is a cross-sectional view illustrating an intermediate stage of performing an energy treating process to transform upper portions of the first energy-sensitive patterns into treated portions and performing another energy treating process to transform upper portions of the second energy-sensitive patterns into treated portions, in accordance with some embodiments.

FIG. 21 is a cross-sectional view illustrating an intermediate stage of forming the semiconductor device structure 100 (FIG. 12) by the method 70 of FIG. 4, in accordance with some embodiments. As shown in FIG. 21, after the target layer 103 and the first energy-sensitive patterns 115 are formed (corresponding to the steps S71 and S73 of FIG. 4, and the details have been discussed in the embodiments referring to FIGS. 5-7), an energy treating process is performed on the first energy-sensitive patterns 115 such that the upper portions of the first energy-sensitive patterns 115 are transformed into treated portions 609, in accordance with some embodiments. The respective step is illustrated as the step S75 in the method 70 shown in FIG. 4. The details of the energy treating process are not repeated.

Then, the lining layer 123 is formed conformally covering the first energy-sensitive patterns 115, the treated portions 609, and the target layer 103, and the second energy-sensitive patterns 137 are formed over the lining layer 123. The respective steps are illustrated as the steps S77 and S79 in the method 70 shown in FIG. 4. In some embodiments, the top surface 609T and the sidewalls 609S of the treated portions 609 are covered by the lining layer 123. In the present embodiment, the materials of the first energy-sensitive patterns 115 (i.e., the materials of the first energy-sensitive patterns 115 before they are treated) and the materials of the second energy-sensitive patterns 137 are substantially the same.

Subsequently, another energy treating process is performed on the second energy-sensitive patterns 137 such that the upper portions of the second energy-sensitive patterns 137 are transformed into treated portions 619, in accordance with some embodiments. The respective step is illustrated as the step S81 in the method 70 shown in FIG. 4. In some embodiments, the parameters of the energy treating process performed on the second energy-sensitive patterns 137 are different form the parameters of the energy treating process performed on the first energy-sensitive patterns 115. For example, the energy levels applied in the two energy treating processes are different.

After the treated portions 619 are formed, an etching process is performed in multiple stages using the processes as described above (see FIGS. 10-12), which are not repeated. In some embodiments, during the etching process, the etching rates of the treated portions 609 are different from the etching rates of the treated portions 619. After the etching process is performed, the first openings 180 and the second openings 170 are formed in the target layer 103, as shown in FIG. 12 in accordance with some embodiments. The details of the openings in the target layer 103 are not repeated. The respective step is illustrated as the step S83 in the method 70 shown in FIG. 4. After the first openings 180 and the second openings 170 are formed, the semiconductor device structure 100 is obtained.

Embodiments of the method for preparing a semiconductor device structure with openings having different depths (e.g., the depths D1 are different from the depths D2) are provided in the disclosure. The method includes forming a first energy-sensitive pattern (e.g., one of the first energy-sensitive patterns 115) over a target layer (e.g., the target layer 103), forming a lining layer (e.g., the lining layer 123) covering the first energy-sensitive pattern, and forming a second energy-sensitive pattern (e.g., one of the second energy-sensitive patterns 137) over the lining layer. In some embodiments, the first energy-sensitive pattern and the second energy-sensitive pattern are staggered. The method also includes performing an etching process to form openings (e.g., the openings 170 and 180) in the target layer, and the openings have different depths.

In some embodiments, an energy treating process is performed on the first energy-sensitive pattern to transform at least a portion of the first energy-sensitive pattern into a treated portion before the lining layer is formed. In some embodiments, an energy treating process is performed on the second energy-sensitive pattern to transform at least a portion of the second energy-sensitive pattern into a treated portion before the etching process is performed. In some embodiments, an energy treating process is performed on the first energy-sensitive pattern to transform at least a portion of the first energy-sensitive pattern into a treated portion before the lining layer is formed, and another energy treating process is performed on the second energy-sensitive pattern to transform at least a portion of the second energy-sensitive pattern into another treated portion before the etching process is performed. Since the treated portion(s) have different etching rate(s) than that of the first and second energy-sensitive patterns, openings with different depths can be formed in the target layer through the etching process. As a result, the fabrication cost and time of the semiconductor device structure (e.g., the semiconductor device structure 100) can be reduced, and greater design flexibility can be achieved.

In one embodiment of the present disclosure, a method for preparing a semiconductor device structure is provided. The method includes forming a target layer over a semiconductor substrate, and forming a first energy-sensitive pattern over the target layer. The method also includes forming a lining layer covering the first energy-sensitive pattern, and forming a second energy-sensitive pattern over the lining layer. The first energy-sensitive pattern and the second energy-sensitive pattern are staggered. The method further includes performing an etching process to form a first opening and a second opening in the target layer. The first opening and the second opening have different depths.

In another embodiment of the present disclosure, a method for preparing a semiconductor device structure is provided. The method includes forming a target layer over a semiconductor substrate, and forming a plurality of first energy-sensitive patterns over the target layer. The method also includes forming a lining layer conformally covering the first energy-sensitive patterns. A first opening is formed over the lining layer and between the first energy-sensitive patterns. The method further includes filling the first opening with a second energy-sensitive pattern, and performing an etching process to form a plurality of second openings and a third opening in the target layer, wherein the third opening is between the second openings, and the second openings and the third opening have different depths.

The embodiments of the present disclosure have some advantageous features. By forming the lining layer and the first and second energy-sensitive patterns over the target layer, the openings with different depths can be formed in the target layer simultaneously. As a result, the fabrication cost and time can be reduced, and greater design flexibility can be achieved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for preparing a semiconductor device structure, comprising:
    forming a target layer over a semiconductor substrate;
        forming a first energy-sensitive pattern over the target layer;
    performing an energy treating process to transform an upper portion of the first energy-sensitive pattern into a treated portion;
    forming a lining layer covering the treated upper portion of the first energy-sensitive pattern and the target layer;
    forming a second energy-sensitive pattern over the lining layer without performing the energy treating process to the second energy-sensitive pattern, wherein the treated portion of the first energy-sensitive pattern and the second energy-sensitive pattern are staggered; and
    performing an etching process to completely remove the treated upper portion of the first energy-sensitive pattern, the second energy-sensitive pattern and the lining layer and to partially remove the target layer to form a first opening and a second opening in the target layer, wherein the first opening and the second opening have different depths, wherein an etching rate of the treated upper portion of the first energy sensitive pattern is different from an etching rate of the second energy-sensitive pattern during the etching process.

2. The method for preparing a semiconductor device structure of claim 1, wherein the first opening and the second opening are staggered.

3. The method for preparing a semiconductor device structure of claim 1, wherein the second energy-sensitive pattern is separated from the first energy-sensitive pattern by the lining layer.

4. The method for preparing a semiconductor device structure of claim 1, wherein a top surface and sidewalls of the first energy-sensitive pattern are covered by the lining layer.

5. The method for preparing a semiconductor device structure of claim 1, wherein a bottom surface of the second energy-sensitive pattern is higher than a bottom surface of the first energy-sensitive pattern.

6. The method for preparing a semiconductor device structure of claim 1, wherein a top surface of the second energy-sensitive pattern is higher than a top surface of the first energy-sensitive pattern.

7. The method for preparing a semiconductor device structure of claim 1, wherein a top surface of the first energy-sensitive pattern is higher than a bottom surface of the second energy-sensitive pattern.

8. The method for preparing a semiconductor device structure of claim 1, wherein the lining layer includes an organic polymer material.

9. The method for preparing a semiconductor device structure of claim 1, wherein the first energy-sensitive pattern, the second energy-sensitive pattern, and the lining layer are removed during the etching process.

10. The method for preparing a semiconductor device structure of claim 1, wherein the first energy-sensitive pattern and the second energy-sensitive pattern are made of different materials.

11. The method for preparing a semiconductor device structure of claim 1, wherein a material of the first energy-sensitive pattern is the same as a material of the second energy-sensitive pattern.

* * * * *